(12) United States Patent
Lin et al.

(10) Patent No.: US 6,743,732 B1
(45) Date of Patent: Jun. 1, 2004

(54) ORGANIC LOW K DIELECTRIC ETCH WITH NH₃ CHEMISTRY

(75) Inventors: Li-Te Lin, Hsin-Chu (TW); Li-Chih Chao, Yang-mei (TW); Chia-Shiung Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 153 days.

(21) Appl. No.: 09/769,812

(22) Filed: Jan. 26, 2001

(51) Int. Cl.⁷ ............................................. H01L 21/302
(52) U.S. Cl. ...................... 438/706; 438/710; 438/712; 438/720; 216/37; 216/67
(58) Field of Search ................................ 438/706, 710, 438/712, 714, 720; 216/37, 67

(56) References Cited

U.S. PATENT DOCUMENTS

| | | | |
|---|---|---|---|
| 5,897,377 A | | 4/1999 | Suzuki .................... 438/706 |
| 5,972,235 A | | 10/1999 | Brigham et al. ............. 216/49 |
| 6,051,503 A | * | 4/2000 | Bhardwaj et al. ........... 438/705 |
| 6,063,712 A | | 5/2000 | Gilton et al. ............... 438/756 |
| 6,071,815 A | | 6/2000 | Kleinhenz et al. .......... 438/689 |
| 6,080,529 A | * | 6/2000 | Ye et al. .................... 430/318 |
| 6,191,043 B1 | * | 2/2001 | McReynolds ................ 438/710 |
| 6,245,662 B1 | * | 6/2001 | Naik et al. .................. 438/622 |
| 6,326,302 B1 | * | 12/2001 | Joubert et al. ............... 438/638 |
| 6,436,808 B1 | * | 8/2002 | Ngo et al. ................... 438/623 |
| 6,455,431 B1 | * | 9/2002 | Hsieh et al. ................. 438/691 |
| 6,458,516 B1 | * | 10/2002 | Ye et al. ..................... 430/317 |

\* cited by examiner

*Primary Examiner*—Lan Vinh
(74) *Attorney, Agent, or Firm*—George O. Saile; Stephen B. Ackerman; William J. Stoffel

(57) ABSTRACT

A plasma etch process for organic low-k dielectric layers using $NH_3$ only, or $NH_3/H_2$ or $NH_3/H_2$ gases. A low k dielectric layer is formed over a substrate. A masking pattern is formed over the low k dielectric layer. The masking pattern has an opening. Using the invention's etch process, the low k dielectric layer is etched through the opening using the masking pattern as an etch mask. In a first embodiment, the etch process comprises: etching the low k dielectric layer by applying a plasma power and flowing only $NH_3$ gas. In a second embodiment, the etch process comprises: etching the low k dielectric layer by applying a plasma power and flowing only $NH_3/H_2$ gas. In a third embodiment, the etch process comprises: etching the low k dielectric layer by applying a plasma power and flowing only $NH_3/N_2$ gas. The invention's $NH_3$ containing plasma etch etches organic Low k materials unexpectedly fast. The invention's $NH_3$ only etch had a 30 to 80% high etch rate than $N_2/H_2$ etches of low-k materials like Silk™.

7 Claims, 3 Drawing Sheets

ORGANIC LOW K DIELECTRIC ETCH WITH NH₃ CHEMISTRY

BACKGROUND OF INVENTION

1) Field of the Invention

This invention relates generally to fabrication of semiconductor devices and more particularly to the etching of organic low-k dielectric layers and particularly an etch process for organic low K layers that uses a ammonia based chemistry (e.g., pure ammonia or ammonia with ($H_2$ or $N_2$))

2) Description of the Prior Art

Traditional etch chemistry for the organic low-k material is $N_2$ related chemistry, such a s $N_2/O_2$ and $H_2/H_2$ etc. The excellent physical profile of the damascene structure can be obtained by $N_2/H_2$ chemistry with a lower etch rate, compared to $N_2/O_2$ chemistry. However, it is very likely to get a bowing sidewall profiles (e.g., non-vertical sidewalls) by $N_2/O_2$ chemistry.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,071,815 (Kleinhenz et al.) that shows a silicon oxide layer etch that uses HF and ammonia in combination with other gases.

U.S. Pat. No. 5,897,377 (Suzuki) shows a surface treatment etch.

U.S. Pat. No. 5,972,235 (Brigham et al.) shows a low-k etch.

U.S. Pat. No. 6,063,712 (Gilton et al.) teaches an oxide etch using ammonia a fluorine containing compound and a boron containing compound.

However, further improvement is needed to etch organic low-K materials.

SUMMARY OF THE INVENTION

It is an object of the present invention to provide a method for etching low-k dielectric layers.

It is an object of the present invention to provide a method for etching low-k dielectric layers that uses an ammonia based chemistry.

It is an object of the present invention to provide a method for etching low-k dielectric layers that uses an pure ammonia or $NH_3/H_2$ or $NH_3/N_2$ etch gasses plus optionally CO and/or $O_2$.

To accomplish the above objectives, the present invention provides a method which is characterized as follows. An organic low k dielectric layer is formed over a substrate. A resist pattern is formed over the low k dielectric layer. The resist pattern has an opening.

Using the invention's etch process, the organic low k dielectric layer is etched through the opening in an etch mask. The invention's etch process comprise a $NH_3$ containing plasma etch (optionally with $H_2$ or $N_2$).

The invention's $NH_3$ containing plasma etch etches Low k materials unexpectedly well. The invention's $NH_3$ only etch had a 30 to 80% higher etch rate than conventional $N_2/H_2$ etches of low-k materials like Silk™.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

I. Overview—$NH_3$ Based Etch for Organic Low K Dielectric Layers

To accomplish the above objectives, the present invention provides a method for etching organic low-k dielectric layers which is characterized as follows.

Organic Low K Compositions

The invention is an ammonia etch ($NH_3$) chemistry for organic low K layers. "Low K" means dielectric constants less than or equal to 3.0. The organic low k dielectric layers can be any organic dielectric material with a dielectric constant less than or equal to 3.0. These dielectric layers are made from organic-containing reactants. Examples of two types of low k materials are: 1) organic/Spin on (e.g., K=~2.6 to 2.7 (Silk™ and Flare™ by made by Allied signal (e.g., fluorinated arylether)) and 2) oxide/CVD (k=2.7 to 3.0) (e.g., Black diamond™, coral™ etc. e.g., carbon doped oxides)

Other organic low k materials are PAE II, Benzocyclobuthene (BCB), amorphous teflon (Polytetrafluoroethylene) and Parylene. Also, HOSP™ from AlliedSignal, hydrogen silsequioxane (HSQ) for example FOx™ flowable oxide brand HSQ.

Figure 6A:
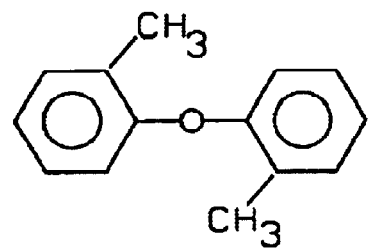
FIG. 6A shows the chemical structure for PAE.

One such organic low k dielectric layer is comprised of poly arylene ether (PAE) possibly with other functional groups—See FIG. 6A for the chemical structure of PAE.

Figure 6B:
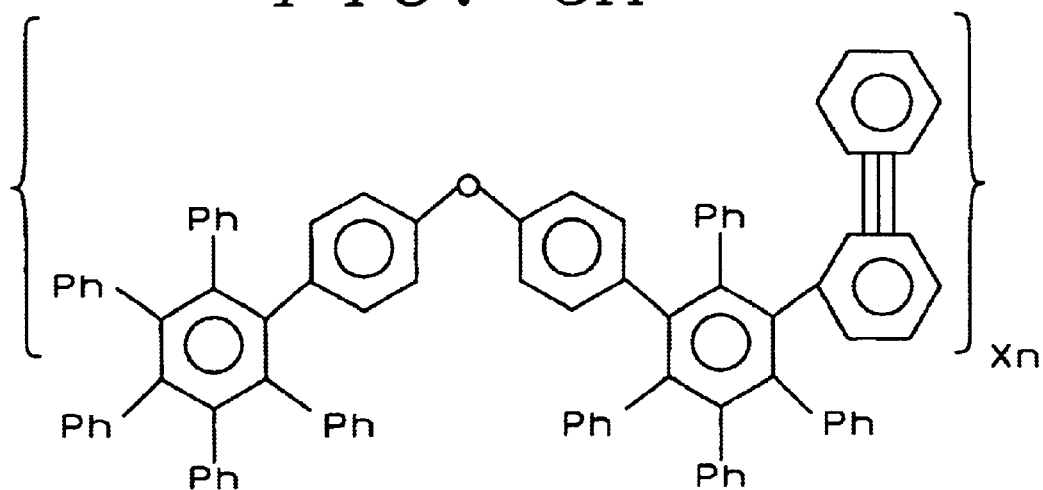
FIG. 6B shows the chemical structure for Silk™ (A PAE containing organic dielectric with aromatic rings).

FIG. 6B shows the chemical structure of SILK™ (e.g., Silk TM made by Dow chemical ). Another example of a low-k dielectric. Silk™ has aromatic groups which can be etched with $O_2$ based $H_2/H_2$ and $NH_3$ based chemistries. It is possible that $N_xH_y$ and H radicals attack the rings during the etch.

The invention's $NH_3$ containing etch is preferably used to PAE containing low K materials such as SilK™ and Flare™.

A. Etch process—1$^{st}$ Embodiment—$NH_3$ Only

In a first embodiment of the invention's $NH_3$ containing etch, the etch process comprises: etching the low k dielectric layer 20 by applying a plasma power and flowing only $NH_3$ gas. It is critical that only $NH_3$ gas is flowed. It is not proper to use another N and/or H containing gas such as $N_2/H_2$.

The $1^{st}$ embodiment uses $NH_3$ only with a power in between 500 and 1500 W, medium plasma power plasma density between 1E9 and 1E11 $cm^{-3}$ and a $NH_3$ flow between 50 and 300 sccm and a pressure between 80 and 800 mTorr. Typical process is power 1000 W and a $NH_3$ flow 200 sccm and a pressure 100 mTorr (all values range +/−5).

Also the $1^{st}$ embodiment forms a substantially vertical sidewall (between 87 and 93 degrees to the surface of the substrate.

B. Second Embodiment $NH_3$ and $H_2$

In a second embodiment, etch process comprises: etching the low k dielectric layer (e.g. 20, FIG. 1) by applying a medium plasma density between 1E9 and 1E11 $cm^3$ and flowing $NH_3$ gas and $H_2$ gas.

The $2^{ND}$ embodiment uses $NH_3$ and $H_2$ with a plasma power between 500 and 1500 W, medium plasma power plasma density between 1E9 and 1E11 $cm^{-3}$, a $NH_3$ flow between 50 and 300 sccm, a $H_2$ flow between 50 and 300 sccm and a pressure between 80 and 800 mTorr. Typical process parameters are power 1000 W and a $NH_3$ flow 100 Sccm, $H_2$ flow about 200 sccm and a pressure 100 mTorr (all values range +/−5).

C. $3^{rd}$ Embodiment—$NH_3$ and N2

The $3^{ND}$ embodiment uses $NH_3$ and $N_2$ with a power in between 500 and 1500 W, medium plasma power plasma density between 1E9 and 1E11 $cm^{-3}$, a $NH_3$ flow between 50 and 300 sccm and a $N_2$ flow between 50 and 300 sccm and a pressure between 80 and 800 mTorr. Typical process is power 1000 W and a $NH_3$ flow 67 sccm, $N_2$ flow about 266 sccm, and a pressure 100 mTorr (all values range +/−5).

D. Optional CO and $O_2$

All, embodiments of the invention's $NH_3$ containing etch can include additional CO and $O_2$ flows. The CO and $O_2$ are thought to remove polymer from the low K layer sidewalls and can create bowed (non vertical) sidewall profiles.

E. Medium Density Process and Tool

It is important to realize that the processes (all embodiments) are preferably performed in a medium plasma density between 1E9 and 1E11 $cm^{-3}$. This is contrast with High density plasma between 1.1E11 and 1E12 $cm^{-3}$. The invention can be performed in a medium density tool, TEL's Rie tools models DRM and SCCM. Thus the process in DRM should also work for SCCM in a similar way.

The invention's medium density tools contrast with High density plasma tools (plasma density between 1E11 and 1E12 $cm^{-3}$) such as Applied Materials IPS and LAM's TCP 9100.

II. Invention's Hard Mask Etch Step

Below are example process for single and dual damascene structure. Any of the hard mask (HM) layers or stop layers (e.g., via and trench liner stop layers) can be etched by the following process.

The hard mask (HM) or stop layer etch step preferably comprises: a $CF_4/O_2/Ar$ or $C_4F_8/O_2/Ar$ etch flow with a power between 1000 and 1500 W, a pressure between 40 and 50 mTorr and a $CF_4$ flow between 40 and 80 sccm (C4H8 between 8 and 12 sccm), $O_2$ flow between 5 and 20 sccm and Ar flow between 100 and 200 sccm, and medium plasma density between 1E9 and 1E11 $cm^{-3}$.

III. Single Damascene Structure

Figure 1:
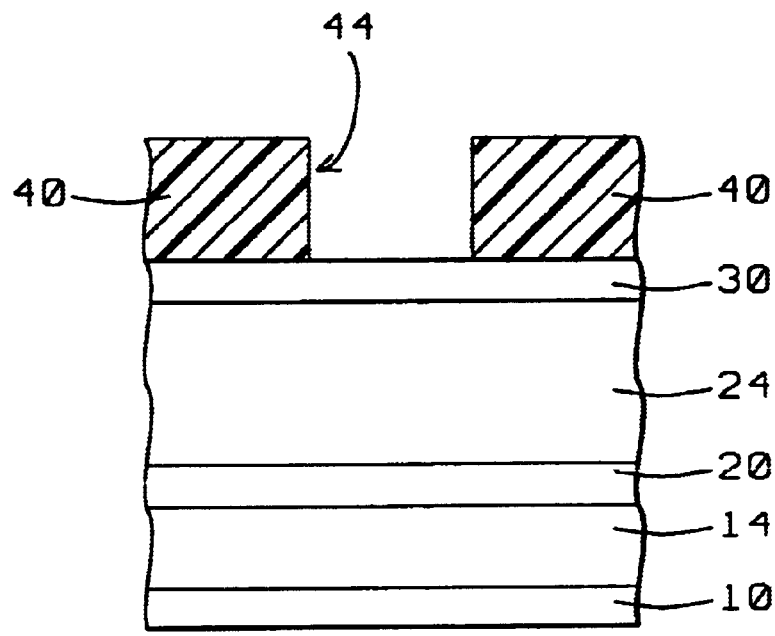
FIGS. 1 and 2 are cross sectional views for illustrating an etch process for etching organic low k materials in a single damascene structure according to the present invention.
Figure 2:
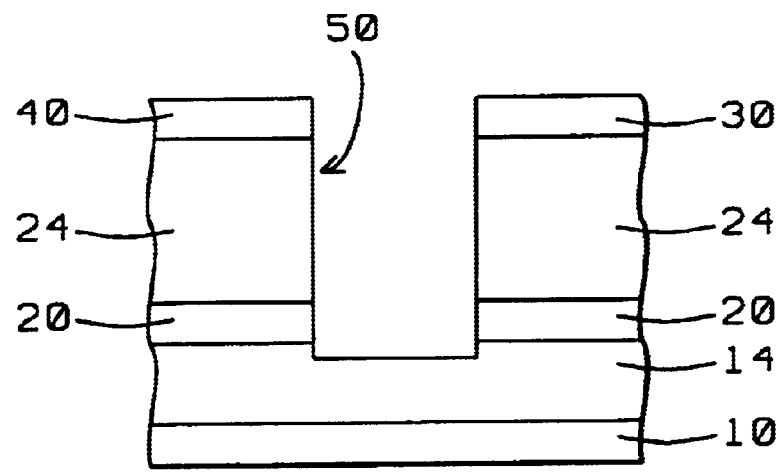

FIGS. 1 and 2 show an option for a single damascene structure.

A semiconductor structure 10 14 is provided. Semiconductor Structure 10 is understood to possibly include a semiconductor wafer 10, active and passive devices formed within the wafer; and insulating and conductive layers (e.g., 14) formed on the wafer surface. For example, layer 14 can be an insulating layer such as an inter metal dielectric (IMD) layer or an etch stop layer.

Over the substrate 10 the following layers are preferably formed. A stop liner layer 20 preferably with a thickness of between about 300 and 500 Å. Next, we form a first low k organic inter metal dielectric (IMD) layer 24 preferably with a thickness between 2000 and 4000 Å. Over that, we form a hardmask layer 30 with a thickness between 500 and 2500 Å. The stop liner and hard mask layers can be made of silicon oxide, Silicon oxynitride(SiON), carbide or Silicon nitride (SiN) and are preferably formed of SiN. Next, we form a resist layer 40 with a first opening 44.

The wafer is placed in an etch tool. The following etch steps are preferably performed insitu.

A. HM Open Etch Step

A hard mask (HM) open etch step is performed to etch thru the HM layer 30. The HM etch step preferably comprises: a $CF_4/O_2/Ar$ or $C_4F_8/O_2/Ar$ etch with a power between 1000 and 1500 W, a pressure between 40 and 50 mTorr and a $CF_4$ flow between 40 and 80 sccm (C4H8 between 8 and 12 sccm), $O_2$ flow between 5 and 20 sccm and Ar flow between 100 and 200 sccm.

B. Organic Low K dielectric Etch Step

Next, we etch thru organic Low K dielectric layer 24 using one of invention's embodiments for the $NH_3$ based etch. (See above). During the etch, the photoresist can be removed (e.g., demonstrated $NH_3$ based resist ashing).

C. Stop Liner Etch

Next, a stop liner etch step is performed preferably using the following parameters: a $CH_xF_y/O_2/Ar$ (such as $CH_2F_2/O_2/Ar$ or $CHF_3/O_2/Ar$ flow) with a RF power between 300 and 500 W, pressure between 30 and 40 mtorr, $CH_2F_2$ flow between 10 and 20 sccm (CHF_3 between 10 and 20 sccm), $O_2$ flow between 5 and 20 sccm, and Ar flow between 100 and 200 sccm.

FIG. 2 shows the structure after the etch steps and opening 50 is formed.

IV. Dual Damascene Process

Figure 3:
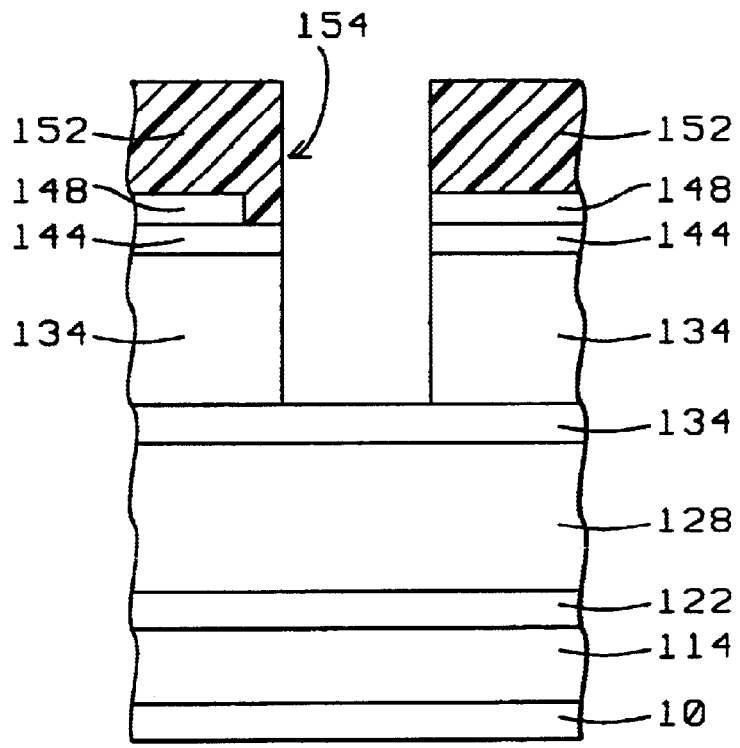
FIGS. 3 and 5 are cross sectional views for illustrating an etch process for etching organic low k materials in a dual damascene structure according to the present invention.
Figure 4:
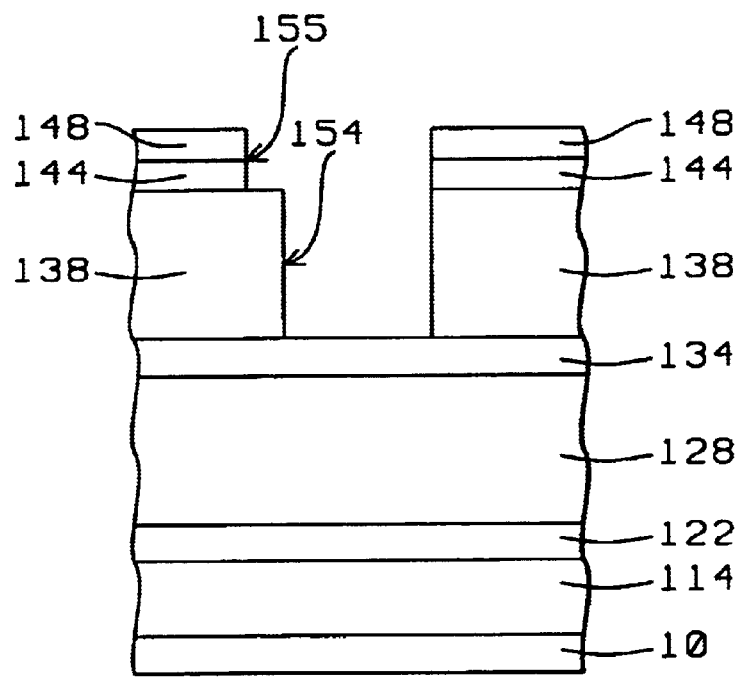
Figure 5:
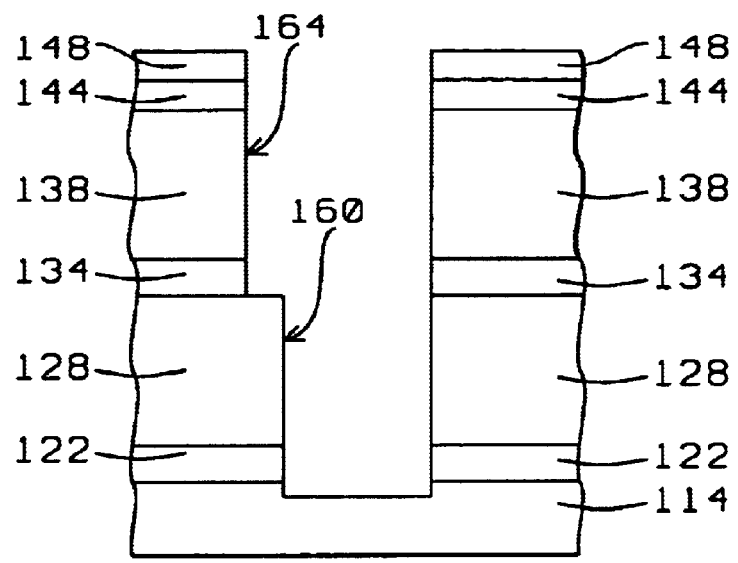

FIGS. 3, 4 and 5 show a preferred process for a dual damascene process.

FIG. 3 shows the following structure:

Substrate 10 (e.g., SI wafer)

dielectric layer 114 (e.g., inter metal dielectric)

via stop layer—thickness between 300 and 500 Å first organic IMD layer 128—thickness between 3000 and 5000 Å trench stop layer 134—(optional) thickness between 0 and 500 Å organic IMD trench layer (second IMD layer)—thickness between 3000 and 5000 Å.

second hard mask 144–500 and 1500 Å first hard mask 148–1500 and 2500 Å

The hard mask (HM) 144 148 and stop layers 122 134 can be formed of silicon oxide, SiON, carbide or SIN and are preferably formed of silicon nitride (SiN).

A. HM1 Open for Via

As shown in FIG. 3, in a first etch step, the HM1 148 is etched to form a first HM opening. The hard mask open etch is the same as describe above in the single damascene process.

B. Via Etch in Trench Layer with Resist Removal

The next etch step is a via etch of the second organic low-k inter metal dielectric layer 138 to form first opening 154 (See FIG. 3). During the etch, the photoresist can be removed (e.g., demonstrated $NH_3$ based resist ashing).

Any of the invention's $NH_3$ based etch embodiments can be used.

C. Trench Stop Layer 134 & HM 2 144 etch

As shown in FIG. 4, a trench stop layer 134 & HM2 144 etch step is performed to form HM opening 155 and to remove the trench stop layer 134 in opening 154. This step can the same etch as the HM open etch steps. See above.

D. Trench and Via Etch

As shown in FIG. 5, the trench opening 164 and via opening 160 are formed by an etch using the HM1 148 and trench stop 134 as etch masks. The etch etches the organic low k layers 138 and 128 to form trench opening 164 and via opening 160. The etch uses the invention's $NH_3$ containing etch.

E. Trench Liner 134 and Via Stop Liner 122 Etch

Still referring to FIG. 5, the trench liner 134 and via stop liner 122 are etched to remove the trench liner 134 and via stop liner 122 1 in the openings 164 and 160. The trench liner etch is the same as describe above in the single damascene process (E.g., $CH_2F_4/O_2/AR$ or $CHF4/O_2/Ar$ etch).

F. Benefits of the Invention

The invention's $NH_3$ containing plasma etch etches organic Low-k materials unexpectedly well and fast. This increases the etch rate without forming polymers and allows for vertical sidewalls of the low-k material.

The invention's $NH_3$ only etch had a 30 to 80% high etch rate than conventional $N_2/H_2$ etches of low-k materials like Silk™ (e.g., PAE containing dielectric layers).

V. Examples

The inventors performed the following experiments.

Etch rate comparison

| Gas flow ratio | Etch rate (K Å/min) |
|---|---|
| 100 $N_2$/300 $H_2$ | 1.6 |
| 200 $NH_3$ | 3 |
| 50 $N_2$/350 $H_2$ | 1.4 |
| 100 $NH_3$/200 $H_2$ | 2.4 |
| 100 $NH_3$/200 $H_2$ | 1.7 |
| 67 $NH_3$/366 $H_2$ | 2.6 |

With same atomic ratio, the invention's $NH_3$ based chemistry produced a higher etch rate.

Unless explicitly stated otherwise, each numerical value and range should be interpreted as being approximate as if the word about or approximately preceded the value of the value or range.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and non-conformal, and capabilities, such as depositing and etching, and other materials and apparatus can be substituted as is well understood by those skilled in the microelectronics arts after appreciating the present invention.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of etching a low-k dielectric layer, comprising the steps of:
   a) forming an organic low-k dielectric layer over an insulation layer over a substrate;
   b) forming a masking pattern over said organic low k dielectric layer; said masking pattern having an opening;
   c) using an etch process to etch said organic low k dielectric layer through said opening to form a first opening using said masking pattern as an etch mask; said etch process comprising:
      (1) in a first step, etching said organic low k dielectric layer by applying a plasma power and flowing $NH_3$ and $H_2$ etch gasses and flowing $O_2$ or CO gasses.

2. The method of claim 1 wherein said first step comprises:
   a plasma power between 500 and 1500 W, plasma power plasma density between 1E9 and 1E11 $cm^{-3}$, a $NH_3$ flow between 50 and 300 sccm, a $H_2$ flow between 50 and 300 sccm and a pressure between 80 and 800 mTorr and flowing $O_2$ or CO gasses.

3. The method of claim 1 wherein said organic low k dielectric is comprised of a material selected from the group consisting of fluorinated arylether, Benzocyclobuthene (BCB), amorphous teflon, carbon doped oxides, poly arylene ether (PAE) and organic Spin on materials.

4. The method of claim 1 wherein said organic low k dielectric is comprised of a material selected from the group consisting of fluorinated arylether, and poly arylene ether.

5. The method of claim 1 wherein said organic low k dielectric is comprised of carbon doped oxide.

6. The method of claim 1 wherein said organic low k dielectric is comprised of poly arylene ether (PAE).

7. The method of claim 1 wherein said etch forms said first opening through said organic low k dielectric layer; said first opening having sidewalls defined by said organic low k dielectric layer; said sidewalls are substantially vertical at a angle between 87 and 93 degrees to the surface of the substrate; and said first step comprises:
a plasma power between 500 and 1500 W, plasma power plasma density between 1E9 and 1E11 $cm^{-3}$, a $NH_3$ flow between 50 and 300 sccm, a $H_2$ flow between 50 and 300 sccm and a pressure between 80 and 800 mTorr and flowing $O_2$ or CO gasses.

* * * * *